(12) United States Patent
Caruso et al.

(10) Patent No.: US 12,051,901 B1
(45) Date of Patent: Jul. 30, 2024

(54) SYSTEM AND METHOD FOR DISTRIBUTED, SECURE, POWER GRID DATA COLLECTION, CONSENSUAL VOTING ANALYSIS, AND SITUATIONAL AWARENESS AND ANOMALY DETECTION

(71) Applicant: Cable Television Laboratories, Inc., Louisville, CO (US)

(72) Inventors: Scott L. Caruso, Arvada, CO (US); Jason W. Rupe, Lafayette, CO (US); Robert F. Cruickshank, III, Louisville, CO (US); Daniel Stoller, Louisville, CO (US); Hunter Albright, Louisville, CO (US)

(73) Assignee: Cable Television Laboratories, Inc., Louisville, CO (US)

(*) Notice: Subject to any disclaimer, the term of this patent is extended or adjusted under 35 U.S.C. 154(b) by 0 days.

(21) Appl. No.: 17/460,444

(22) Filed: Aug. 30, 2021

Related U.S. Application Data

(62) Division of application No. 16/513,676, filed on Jul. 16, 2019, now Pat. No. 11,108,268.

(Continued)

(51) Int. Cl.
 *H02J 13/00* (2006.01)
 *G01R 19/25* (2006.01)
 (Continued)

(52) U.S. Cl.
 CPC .... *H02J 13/00007* (2020.01); *G01R 19/2513* (2013.01); *H02J 3/00* (2013.01);
 (Continued)

(58) Field of Classification Search
 CPC .. H02J 13/0017; H02J 3/00; H02J 9/06; H02J 13/00007; G01R 19/2513; H04Q 9/00; H04Q 2209/10; H04Q 2209/30
 (Continued)

(56) References Cited

U.S. PATENT DOCUMENTS 10,097,241 B1 * 10/2018 Bogdan ................. H04L 43/50
10,414,282 B2    9/2019 Nazarian
(Continued)

FOREIGN PATENT DOCUMENTS

CN           103293421 A        9/2013

OTHER PUBLICATIONS

U.S. Appl. No. 17/337,275, filed Jun. 2, 2021, Scott L. Caruso.
(Continued)

*Primary Examiner* — Tanmay K Shah
(74) *Attorney, Agent, or Firm* — PdZ Patent Law, PLLC

(57) ABSTRACT

A system and method for data collection and aggregation using a distributed network of communications enabled sensors connected to another primary network to achieve a secondary out-of-band monitoring perspective, for example, in power grids. The data collection system includes an aggregation and processing server configured to collect data from a variety of sensors adjacent to the monitored network each sensor includes secondary power such that it can continue data transmission even during power grid outages. The data collection system includes a method for secure real-time data ingest, machine learning enabled analysis, risk assessment, and anomaly detection on a broad geographic scale irrespective of isolated network boundaries.

17 Claims, 6 Drawing Sheets

Related U.S. Application Data

(60) Provisional application No. 62/789,396, filed on Jan. 7, 2019, provisional application No. 62/698,694, filed on Jul. 16, 2018.

(51) Int. Cl.
    *H02J 3/00*   (2006.01)
    *H02J 9/06*   (2006.01)
    *H04Q 9/00*   (2006.01)

(52) U.S. Cl.
    CPC ............... *H02J 9/06* (2013.01); *H04Q 9/00* (2013.01); *H04Q 2209/10* (2013.01); *H04Q 2209/30* (2013.01)

(58) Field of Classification Search
    USPC ....................................................... 340/870.07
    See application file for complete search history.

(56) References Cited

U.S. PATENT DOCUMENTS

| | | | |
|---|---|---|---|
| 10,879,727 B1 | 12/2020 | Cooper | |
| 10,892,838 B2 | 1/2021 | Cruickshank, III et al. | |
| 11,088,568 B2 | 8/2021 | Huberman et al. | |
| 2009/0210357 A1* | 8/2009 | Pudar .................... | H02J 3/322 705/412 |
| 2009/0284072 A1 | 11/2009 | Everett | |
| 2012/0265355 A1 | 10/2012 | Bernheim et al. | |
| 2013/0010781 A1 | 1/2013 | Gresset et al. | |
| 2013/0346768 A1 | 12/2013 | Forbes, Jr. | |
| 2014/0316604 A1 | 10/2014 | Ortjohann et al. | |
| 2015/0006141 A1* | 1/2015 | Enenkel ............ | H02J 13/00017 703/18 |
| 2015/0180538 A1* | 6/2015 | Smith ...................... | H04Q 9/00 375/257 |
| 2016/0077164 A1 | 3/2016 | Toyoshima et al. | |
| 2017/0228479 A1* | 8/2017 | Meagher ................. | G06F 30/20 |
| 2018/0095123 A1 | 4/2018 | Biswas et al. | |
| 2018/0120368 A1 | 5/2018 | Liu et al. | |
| 2018/0159593 A1* | 6/2018 | Bogdan ............... | H04L 12/4625 |
| 2018/0159879 A1 | 6/2018 | Mestha et al. | |
| 2018/0167312 A1* | 6/2018 | Liu ......................... | H04L 45/22 |
| 2018/0260561 A1* | 9/2018 | Mestha ................. | G06F 21/554 |
| 2018/0284743 A1 | 10/2018 | Cella et al. | |
| 2019/0039707 A1 | 2/2019 | Ezaki et al. | |
| 2019/0192768 A1* | 6/2019 | Gupta .................. | A61B 5/1468 |
| 2020/0051038 A1 | 2/2020 | Broers et al. | |
| 2020/0066435 A1 | 2/2020 | Igarashi et al. | |
| 2020/0218973 A1 | 7/2020 | Pi et al. | |

OTHER PUBLICATIONS

U.S. Appl. No. 17/396,860, filed Aug. 9, 2021, Bernardo Huberman.
U.S. Appl. No. 17/460,265, filed Aug. 29, 2021, Scott L. Caruso.
U.S. Appl. No. 17/460,271, filed Aug. 29, 2021, Scott L. Caruso.
U.S. Appl. No. 17/460,444, filed Aug. 30, 2021, Scott L. Caruso.
Meng Zhou, Lanlan Rui, Xuesong Qium Zhe Xia, Biyao Li, Evaluation of the Node Importance in Power Grid Communication Network and Analysis of Node Risk, Apr. 23-27, 2018, pp. 1-5 (Year: 2018).

* cited by examiner

SYSTEM AND METHOD FOR DISTRIBUTED, SECURE, POWER GRID DATA COLLECTION, CONSENSUAL VOTING ANALYSIS, AND SITUATIONAL AWARENESS AND ANOMALY DETECTION

RELATED APPLICATIONS

This application is a divisional of U.S. patent application Ser. No. 16/513,676, filed on Jul. 16, 2019, which claims priority to each of (a) U.S. Provisional Patent Application Ser. No. 62/698,694, filed on Jul. 16, 2018, and (b) U.S. Provisional Patent Application Ser. No. 62/789,396, filed Jan. 7, 2019. Each of the aforementioned patent applications is incorporated herein by reference.

BACKGROUND

The field of the disclosure relates to real-time and interval data collection using massive distributed sensor networks, analysis, and anomaly detection for, in one implementation, power grid systems.

Current monitoring sensor technologies are limited by the need for sufficient power (either wired or through batteries), communications capabilities, and real estate at appropriate locations for effective data collection. Power grids are traditionally monitored through costly installation of new sensors with wireless communication capabilities or through monitoring equipment located at power substations. Both solutions are costly and plagued by delayed data reporting, loss of power when the energy grid suffers a failure, and course data resolution. For example, a single monitored substation may typically serve roughly 1000 or more homes. When power fails at these sites, any sensors connected directly to the power network lose both power and communication capabilities until such a time that power grid is restored. In a power grid embodiment, there can be a serious public safety issues while power is partially or totally offline. Additionally, power grid metrics today suffer from fragmentation issues due to the large number of individual power companies, delays in detection reporting times, and the lack of intelligence with secondary power within the collection framework.

SUMMARY OF THE INVENTION

The invention comprises a system of broadly distributed, secure, cloud-supported and communications-equipped sensors connected to a power grid or other network. These sensors are configured to report measurements into a central processing application where the measurements can be processed, analyzed, and monitored over time. The invention furthermore comprises a method for determining consensus between among a plurality of sensors over given areas and time intervals, which provides improved network metrics and analysis. The invention further discloses a method for providing distribution power grid, or other network, situational awareness and detect and interpret anomalies at various geographies (including regional with multiple utilities, national, and international levels).

BRIEF DESCRIPTION OF THE INVENTION

These and other features, aspects, and advantages of the present disclosure will become better understood when the following detailed description is read with reference to the following accompanying drawings, in which like characters represent like parts throughout the drawings.

Figure 3:
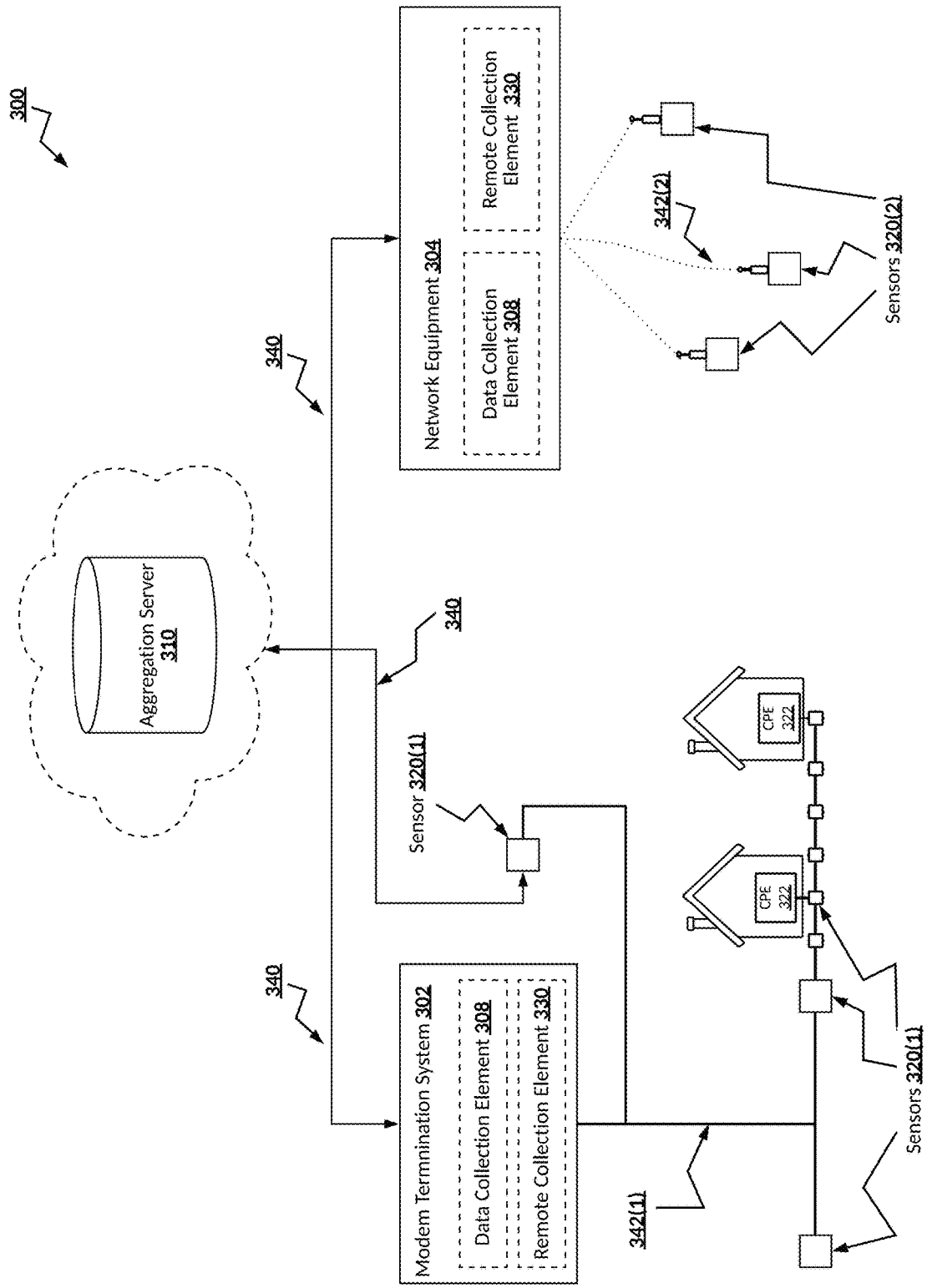

FIG. 3 schematically illustrates two embodiments of a secure adjacent communications network delivering sensor collected data to a central aggregation server for analysis and processing.

Figure 4:
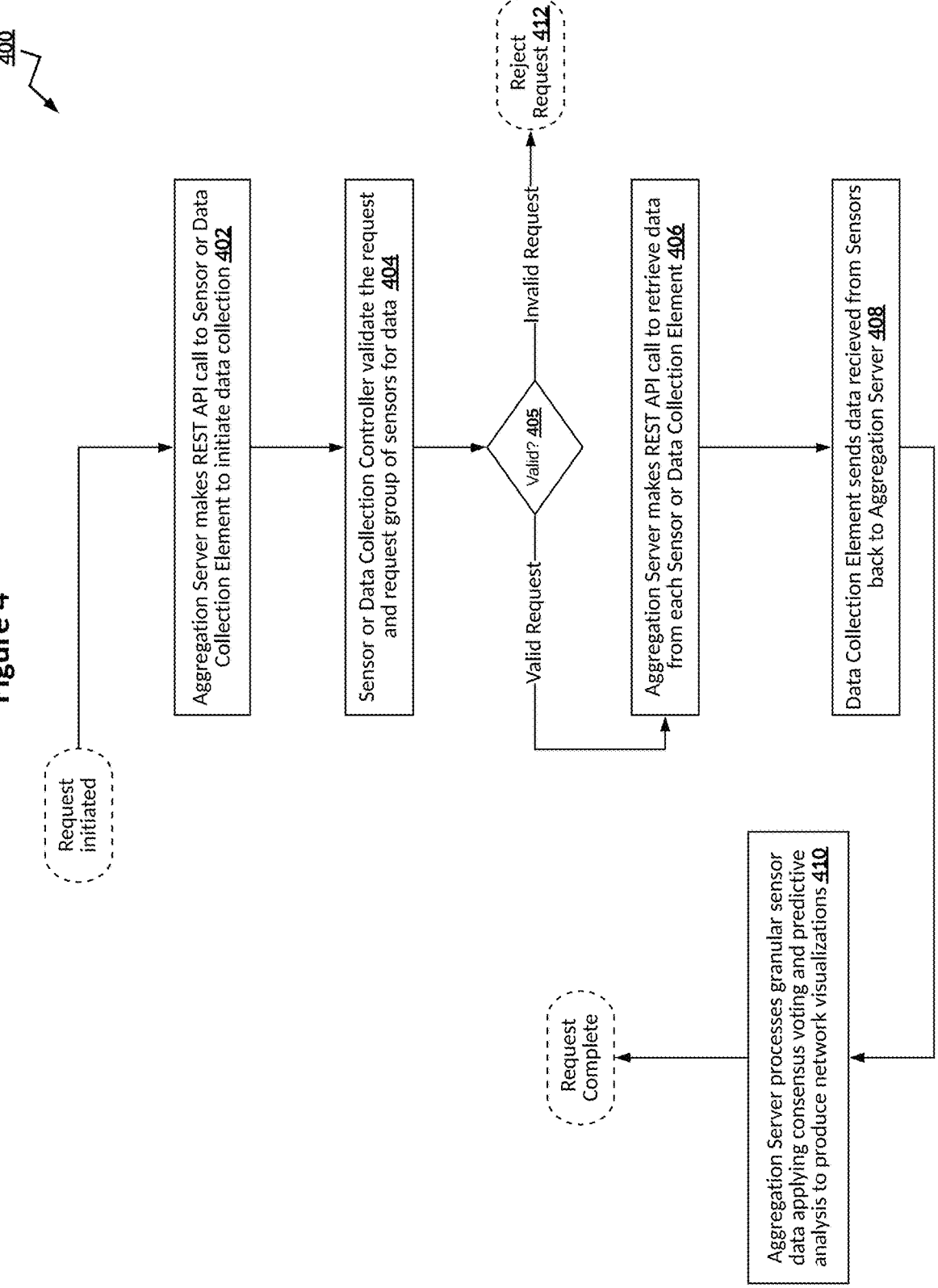

FIG. 4 is a flowchart illustrating one exemplary method that an aggregation server may use to complete a secure push or pull data request to individual or groups of networked sensors.

Figure 5:
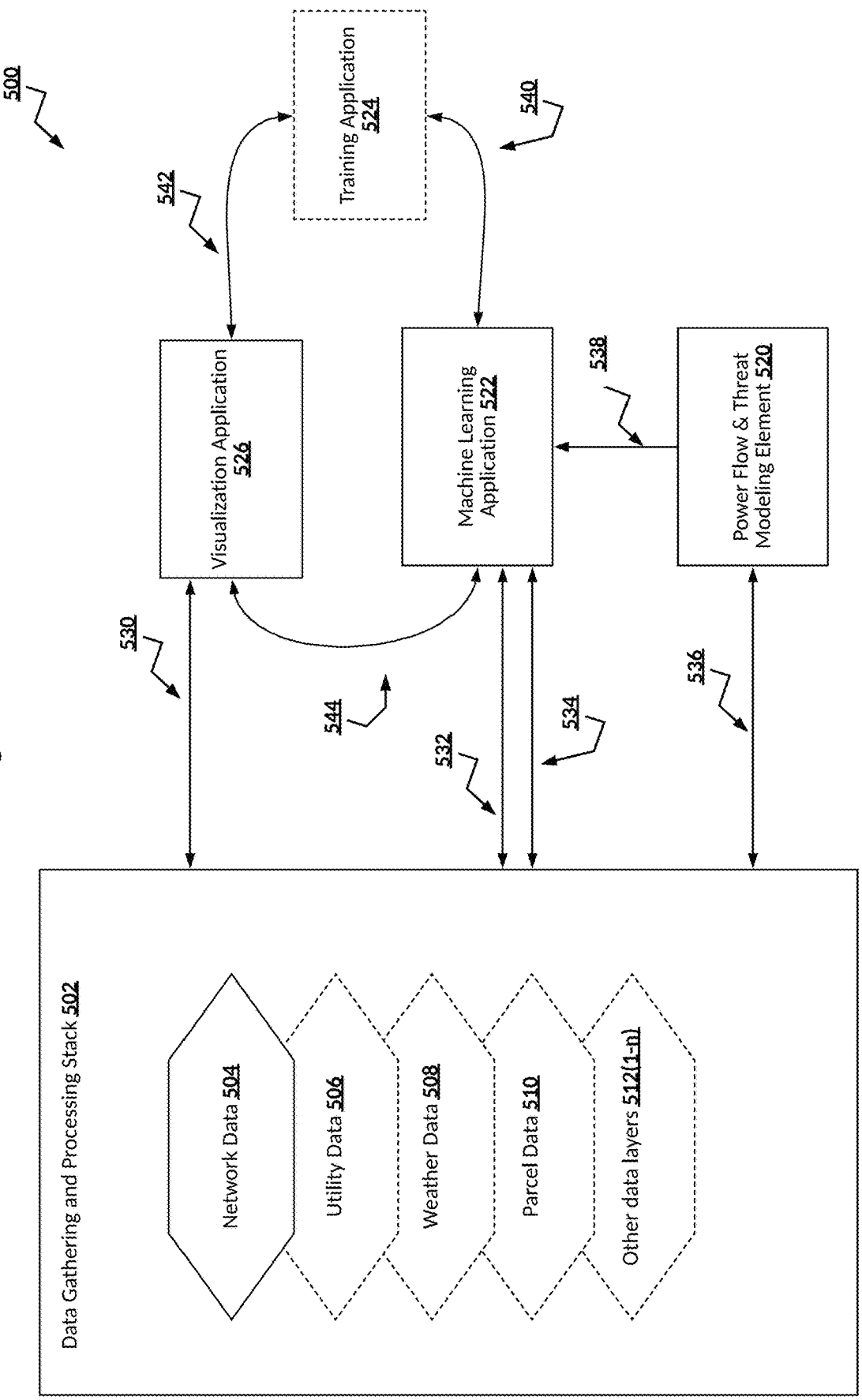

FIG. 5 schematically illustrates one embodiment of a data aggregation and processing system that enables advanced situational awareness, prediction, and anomaly detection in a network.

Figure 6:
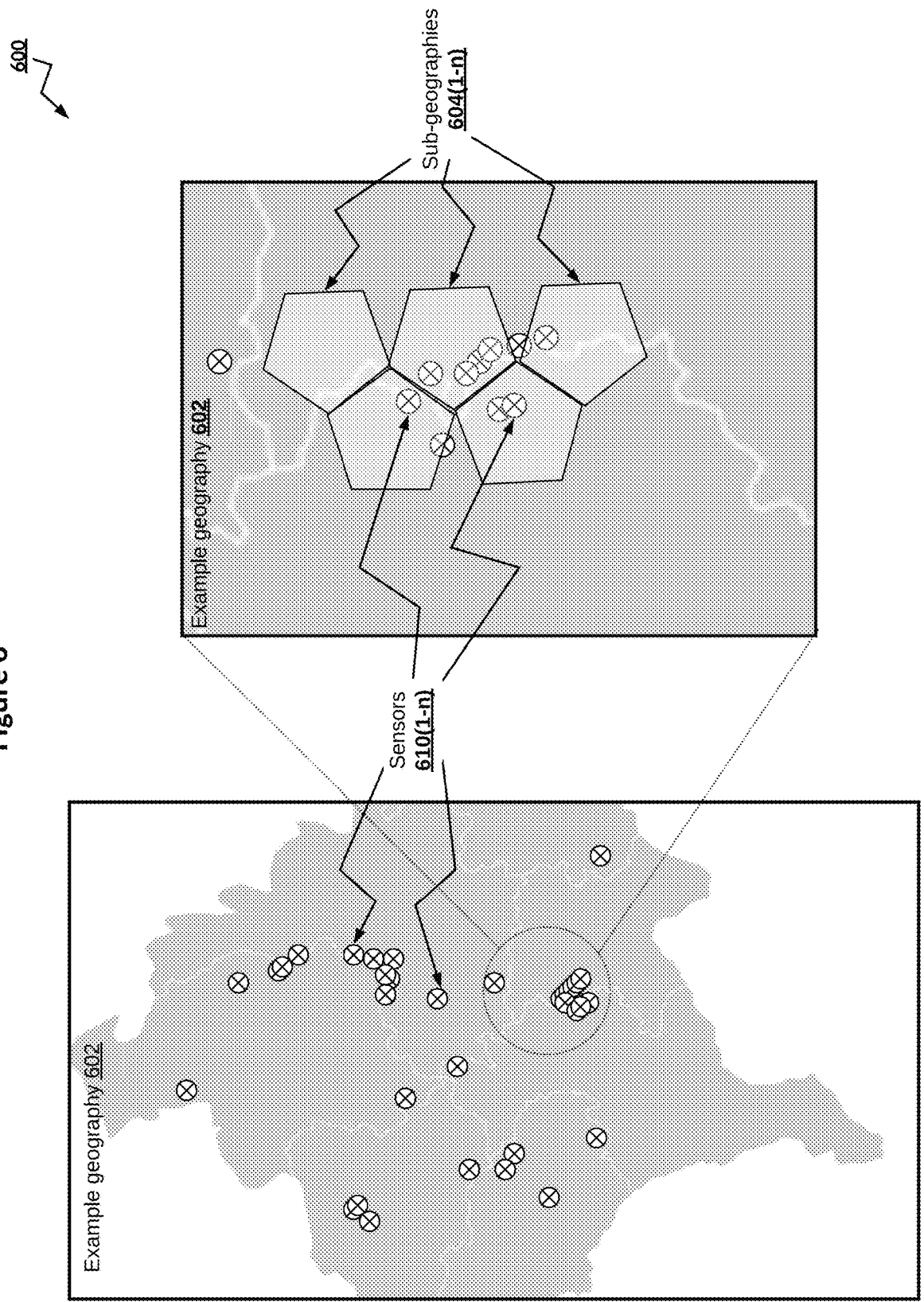

FIG. 6 shows one example of an aggregate sensor data visualization across a geographically distributed sensor network using an example consensual voting implementation.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random-access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable and include any computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

The present systems and methods herein advantageously utilize an adjacent, optionally secure, and alternatively powered communications network to collect data metrics and/or record the status of, for example, a power grid or other systems(s) and/or network(s). The present embodiments may be implemented to augment or, in some circumstances, replace conventional data metrics and power monitoring practices at a more reliable and granular level. Conventional system include costly dedicated power monitoring units with mobile wireless connections (e.g. LTE, 3G, satellite etc.) at substations (which typically serve about 1000 homes) or attached to specific meters which must be collected manually through near-field wireless technologies (e.g. NFC, Bluetooth, etc.). The adjacent, optionally secure communications network described and illustrated herein may include, for example, an adjacent communications network supported by a secondary power source located at the communications service nodes (typically serving 1-500 homes) configured as a data metrics system for monitoring and optionally analyzing a network, such as but not limited to one or more power grids. For ease of explanation, the following description references broadband communication network(s) as one exemplary embodiment of the adjacent, optionally secure, communication network, which is configured with a secondary power capability. A person of ordinary skill in the art, upon reading and comprehending the present description and associated illustrations, will understand that other examples of communications network technologies may be implemented according to the novel and advantageous principles herein.

The embodiments described herein are particularly useful for reliable collection and analysis of power grid network metrics on a geographic scale beyond the broad coverage of any individual electricity provider's network, for example. There are numerous power utility companies that serve only a relatively small portion of the entire energy market. This results in fragmented data from one or more small utility companies that each only cover a portion of a geographic area. The preference, which does not exist today, is a utility data based or manipulated into more traditional geographies and markets such as neighborhoods, cities, regions, states, territories, nations, or other geographies. For monitoring and analysis to be valuable an aggregated data source or scale adjustable data source may be required. One example of where it may be particularly true is for network and infrastructure security on nationwide or global scale where key analyses would only be possible with a comprehensive data stream that spans multiple utility markets in order to analyze broader trends, outages, or anomalies.

Some exemplary embodiments described herein provide systems and methods for monitoring and maintaining a backup or alternative stream of data at a greater detail than is currently achievable with low resolution power grid substation data. In one embodiment of invention herein each monitoring sensor covers a much small geographic area, typically only 1-500 homes depending on the architecture of the deployment of the out-of-band or adjacent network. In these embodiments an alternative data stream may be leveraged to protect, for example, first responders, network technicians, etc. by providing a high quality, detailed/granular, alternatively powered, communicatively coupled out-of-band picture/data of a power grid's status via a variety of possible metrics (including, but not limited to, voltage, currently, direction of electricity flow, quality of the electricity, voltage/current variance, etc.) during normal activity or outage or brown out events providing critically improved situational awareness to, for example first responders, emergency personnel, maintenance personnel, administrators, etc. Nevertheless, a person of ordinary skill in the art will understand, upon reading and comprehending the present application, how the systems and methods described herein apply to other fields (e.g., first responders, commercial or residential insurance, smart contracts, power generation siting, power transaction markets, etc.) where tracking the status and metrics of a network (such as a power grid) through an adjacent communications network with independent/secondary power is valuable.

In some instances, the data collected in real-time can also be securely stored in an aggregation and processing server(s) or, alternatively, in other secure storage, in order to construct a historic dataset. Such a data set enables analysis and could be leveraged for a variety of uses including, but not limited to, power quality metrics over time, restoration and recovery prediction capabilities, or other analysis. In one exemplary embodiment a historical dataset and quality analysis is used to improve insurance policy writing inputs and improve overall cost prediction in a variety of scenarios where the power grid is an integral factor.

The highly granular nature of sensor data combined with in-network machine learning enables a system with significant event (e.g. outage, cybersecurity breach, etc.) prediction capabilities due to the significant amount of raw data input in real-time and historically. Further enabling the predictive processing value and monitoring applications is the agnostic platform nature of the adjacent communications network and back-up power. While network equipment can easily monitor characteristics of electricity (e.g. voltage, current, resistance), because of its modular upgradability and underlying out-of-band communications and power supplies, can be easily configured to monitor an extremely wide range of network, environmental, atmospheric, and other conditions. This flexibility of data input coupled with unconfined geospatial boundaries enables next-generation monitoring, analysis, and prediction for critical infrastructure, such as power grids.

Figure 1:
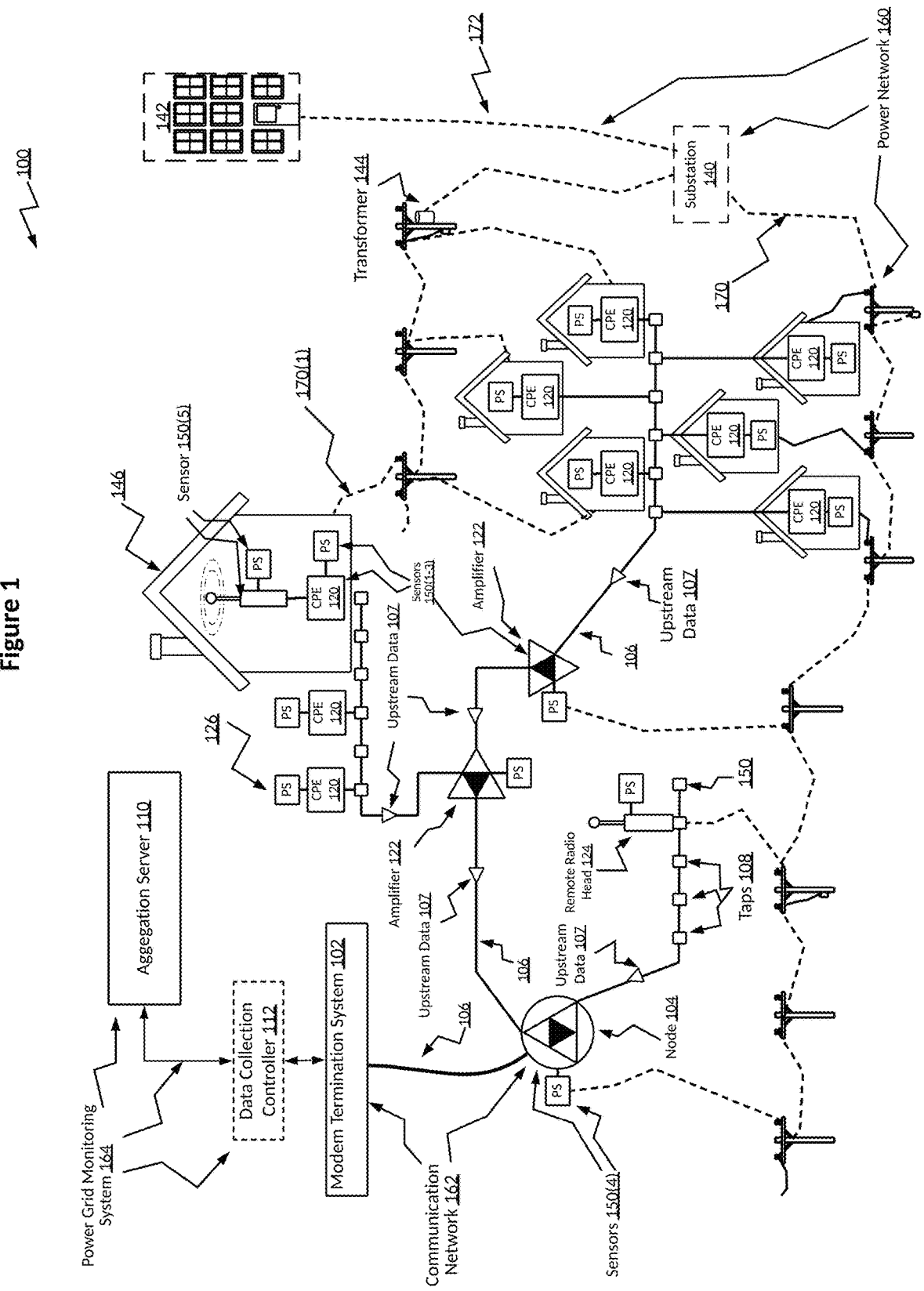
FIG. 1 shows one example of a network that utilizes a distributed, secure, data collection system via an adjacent communications network, according to an embodiment.

FIG. 1 shows a schematic illustration of a resilient first-network-monitoring system configured with distributed data collection elements associated with an adjacent second-communications network/system 100. Network 100 utilizes one or more connected sensors 150 (distributed data collection elements) to collect substantially real-time metrics (e.g. multiple readings on a per second or sub-minute basis) and/or interval data (e.g. 1-minute, 5-minute, or hourly readings).

FIG. 1 is shown having a communication network 162, an adjacent network, here shown and described as a power grid network 160, and a monitoring system 164 associated with communication network 162 for monitoring power grid network 162.

Power grid network 160 is shown to include a generation station 142 connected through a network of transmission power lines 172 to a substation 140. Substation 140 is connected with a network of distribution power lines 170 to a series of transformers 144 connected together by power lines 170. Distribution power lines 170(1) connect the power grid to power users, such as residential homes 146.

Communication network 162 is shown to include a modem termination system 102, A node 104 (although more nodes may be included), amplifiers 122 linked through communications lines 106 (such as DSL, coaxial cable, fiber optic cable, wireless links, etc.), and taps 108. An exemplary communications network 162 typically includes a head-end (not shown) connected with one or more modem termination system(s) 102. Taps 108 are in communication with communications network delivery technologies, such as a remote radio heads 124 (such as a Wi-Fi access point, a small cell or a microcell or similar, etc.) or a customer premise equipment (CPE) 120 (e.g. a modem, a laptop, a smart phone, a tablet, a smart TV, small cell (or similar), or similar networking devices).

Power grid monitoring system 164 is shown to include an aggregation server or servers 110 (also understood as sensor data processing elements) connected, directly or indirectly, with a modem termination system 102. Aggregation server 110 may optionally be connected with a modem termination system 102 directly or through an intermediary data collection controller 112.

In an embodiment, power grid monitoring system 164 may be coupled with communication network 162 via power supplies (PS) 126 which supply primary electrical power to network components (such as nodes 104, some versions of taps 108, amplifiers 122, or CPE 120) throughout a communications network 162. PS 126 may condition, received conditioned power, or be directly or indirectly coupled to a power conditioning element (not shown). Upstream data 107 related to the power/electricity quality or power/electricity metrics of the power grid may be derived from the conditioning elements communication network 162 power conditioning elements, which are utilized to regulate and condition the power provided to communication network 162's active components, such as but not limited to amplifiers 122 and nodes 104, see below for more details.

Power grid monitoring system 164 is coupled with power grid network 160 through an aggregation server 110 through the communications network 162. The power grid monitoring system 164 utilizes the aggregation server 110 to connect to a modem termination system 102 within the communications network 162. The communications network 162 contains the plurality of power supplies (PS) 126 which supply primary electrical power to network components (such as nodes 104, taps 108, amplifiers 122, or CPE 120). These components are part of the communications network 162 and the power grid monitoring 164. For purposes of clarity they are collectively also shown as sensors 150 in system 100 when utilized by the power grid monitoring system 164.

Through its components and connections to the power grid network 160 and communication network 162 power grid monitoring system 164 may monitor, for example, power grid metrics, such as but not limited to status (on/off), voltage, current, reflections, phase, resistance, etc. Power grid monitoring system 164, through its association to communication network 162, has an independent communication path for conveying recorded power grid network 160 metrics. Power grid monitoring system 164 may also have an independent power supply that provides electricity to at least power grid monitoring system 164 if power grid 160 loses capacity or has reduced or limited capacity. In such a situation power grid monitoring system 164 is capable of extended monitoring and communication regarding the status of power grid network 160 even when power grid network 160 does not provide electricity to power grid monitoring system 164 and communication network 162.

In some embodiments, the power grid monitoring system 164 of system 100 and aggregation server 110 may collect a variety of different power grid metrics simultaneously. In this example some sensors 150 collect real-time measurements while other sensors 150 within the same power grid monitoring system 160 collect interval power grid data at, for example, 1-hour intervals. In some embodiments of power grid monitoring system 160 all sensors 150 may be deployed for a single purpose and collect identical types of data (e.g. electrical current, voltage, humidity, temperature, light, sound, particle or chemical readings, etc.). In other implementations, aggregation server 110 aggregates and analyzes a combination of mixed sensor 150 types and transmission frequencies and pathways.

In one embodiment, sensors 150(1-5) may be communications network nodes and/or their power supplies 150(4), customer network equipment and/or their power supplies attached to the power grid 150(1-3). In this embodiment modem termination systems 102, network amplifiers 150(1-3), remote radio heads 124, and/or taps 108 may be, act as or include all or a portion of sensors 150. Additionally, indoor or outdoor wireless communications equipment 150(5) (e.g. small cells, femtocells, picocells, Wi-Fi access points, eNodeBs, gNodeBs, or similar devices) could be used. System 100 is illustrated as an exemplary architecture to implement the power grid monitoring system 164 embodiments of the present disclosure. Other architectures are contemplated by the present inventors, which do not depart from the scope herein. Furthermore, for ease of explanation, redundant components that may be implemented within system 100 are not illustrated, nor are link-level objects or implementations, security authentication objects/sequences/implementations, or other components that may be conventionally utilized in a communications network for communication, availability, or security purposes.

In an exemplary embodiment of power grid monitoring system 164, sensor 150 readings are sent directly or indirectly via wired or wireless communications to a modem termination system 102, where it is processed. Indirect communication may, for example, pass through a node 104 first as shown by connections 106 to then be aggregated. In one embodiment, aggregation server 110 utilizes an optional data collection controller 102 to request and securely receive the sensor 150 readings from the power grid monitoring system 164 network. Alternatively, the upstream data 107 is sent to server 110, which may exist on the internet, where it is accumulated, processed, and analyzed.

Figure 2:
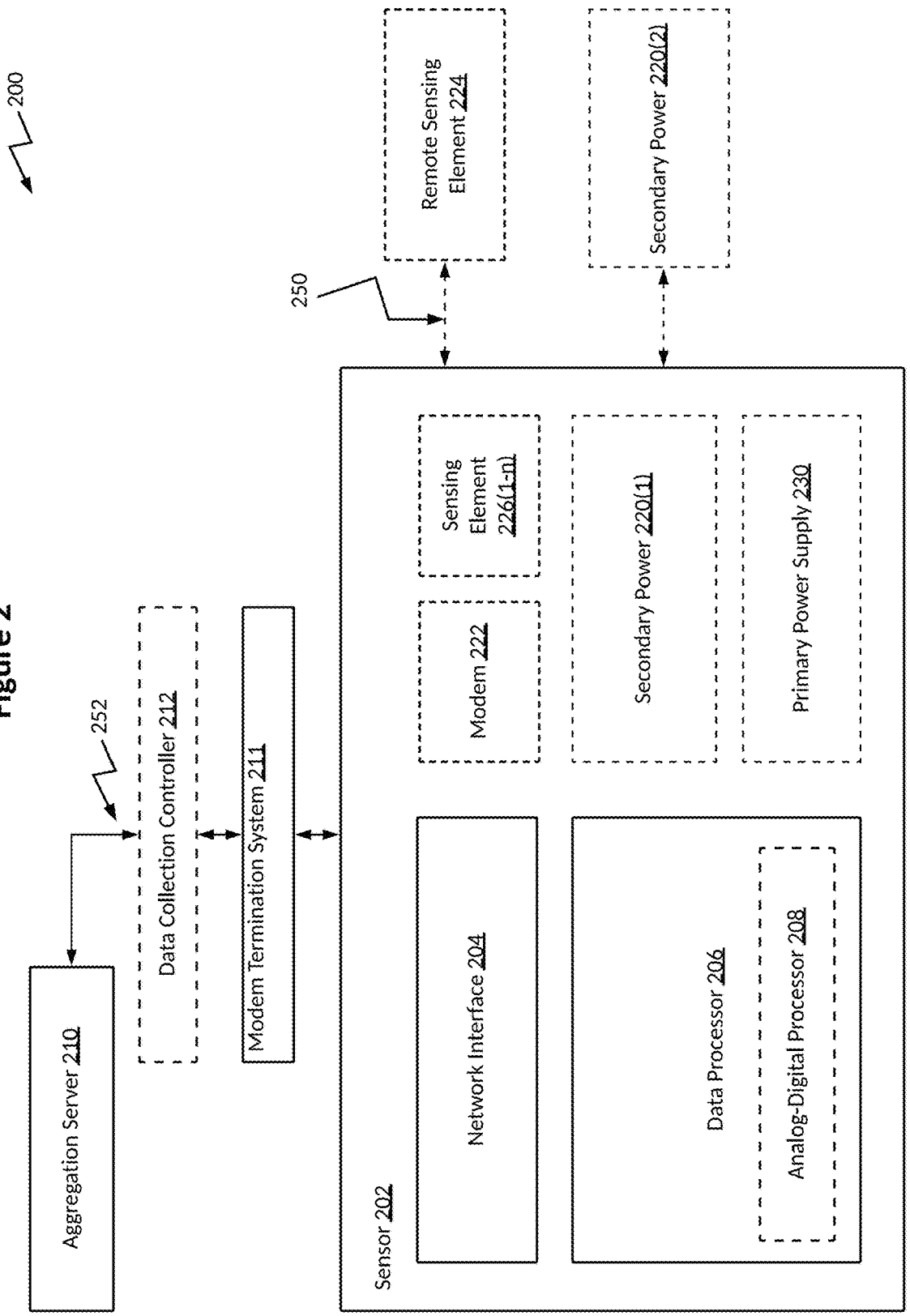
FIG. 2 is a block diagram illustrating one exemplary embodiment of an individual sensor deployable in a distributed data collection system via adjacent communications network.

FIG. 2 is a block diagram 200 illustrating one exemplary embodiment of a sensor 202 deployable in a distributed data collection system, such as power grid monitoring system 164 of FIG. 1, in association with communications network, such as communication system 162 of FIG. 1. Sensor 202 is one example of sensor 150 or FIG. 1.

System 200 is shown to include a sensor 202, a remote sensing element 224, an optional secondary power supply 220(2), an optional data collection controller 212, a modem termination system 211, and an aggregation server 210.

Sensor 202 is shown including a network interface 204, data processor 206, and optionally, a modem 222, sensing element(s) 226(1-n) (in which n can be 0 or any integer, representing a single or a plurality of different or the same sensors), secondary power 220(1), and primary power supply 230. The modem termination system 211 may be the same or similar to the modem termination system 102 of FIG. 1. The primary power supply 230 may be the same or similar to the power supply 126 of FIG. 1. Additionally, sensor 202 is optionally connected with external remote sensing element(s) 224 via a wired or wireless communications connection 250, and/or an external secondary power source 220(2).

Sensor 202 is shown connection to or otherwise in communication (directly or indirectly) with aggregation server 210 via modem termination system 211. Sensor 202 can be connected in to aggregation server 210 directly, or, indirectly through a modem termination system 211. Optionally, sensor 202 is connected to or in direct or indirect communication with sensing element 224, secondary power 220(2), and data collection controller 212.

Non-limiting examples of power sources 220 include but are not limited to a battery, universal power supply (UPS), and/or an energy generation component such as a solar panel a wired or wireless secondary power source, such as backup generator. In one exemplary embodiment of system 200, a sensor 202 (which may be the same or similar to sensor 150 in system 100 of FIG. 1) is connected to an aggregation server 210 (which, may be the same or similar to aggregation server 110 as shown in system 100 of FIG. 1) through a wired or wireless communications channel.

In one or more embodiments, an aggregation server 210 is securely connected with sensor(s) 202. Such an association enables secure data transmission of raw sensor data collected at the modem 222, power supply 230, remote sensing element 224, or other sensing elements 226(1-n), in which n can be 0 or any integer. A network interface 204 and data processor 206 are utilized within sensor 202 to process, receive, transmit, and interact with sensing elements 226(1-n), remote sensing element 224, power supply 230, or modem 222.

In further operation, system 200 may utilize a network interface 204 to communicate directly with an aggregation server 210, or through intermediary network elements (not pictured). Optionally, sensor 202 employs a data collection controller 212 to coordinate data requests and deliveries from sensor 202 to an aggregation server 210. In one exemplary embodiment the data collection controller 212 or aggregation server 210 may use secure data transmission (e.g. simple network management protocol). Data collection can occur within or remotely to sensor 202 either directly through internal sensing elements 226(1-n) or other internal or external components such as an optional modem 222, primary power supply 230, or other means. In some embodiments of system 200 data collection may take place remotely from sensor 202 using external remote sensing element(s) 224 and through either wired or wireless connection 250 to sensor 202. Additionally, a data processor 206 may use an analog to digital processor 208 to convert analog signals received into digital ones for re-transmission to aggregation server 210.

FIG. 3 is a schematic illustration of an exemplary a power grid monitoring system 300 and operates in association with communications network and a power grid network. The power grid monitoring system may be the same or similar to the power grid monitoring system 164 of FIG. 1. The communications system may be the same or similar to the communication system 162 of FIG. 1. The power grid network may be the same or similar to the power grid 160 of FIG. 1. Power grid monitoring system 300 utilizes communications network elements, such as sensors 150 of FIG. 1, to collect, aggregate, store, and analyze metrics in an aggregation server 310. Server 310 may be either the same or a different embodiment as the aggregation server 210 in system 200 or the aggregation server 110 in system 100.

System 300 is shown to include an aggregation server 310, a modem termination system 302, and/or other network equipment 304. Modem termination system 302 and network equipment 304 are configured to optionally include a data collection element 308, and/or remote collection element 330. Modem termination system 302 may be either the same or a different embodiment as modem termination system 102 of FIG. 1 and modem termination system 211 of FIG. 2. System 300 is further shown to include sensors 320(1-2), such as CPE 322 or other communications network elements, such as sensors 150 of FIG. 1 and/or sensing element 226(1-n) of FIG. 2.

Aggregation server 310 is shown in connection to or otherwise in communication (directly or indirectly) with modem termination system(s) 302, sensor(s) 320(1), and/or network equipment 304 through communications connections 340. Communication connection 340 may be wired (e.g. DSL, coaxial cable, fiber optic cables, etc.) or wireless (e.g. LTE, 3G, satellite, Wi-Fi, etc.). A modem termination system 302 or network equipment 304 is further shown in connection with sensors 320(1-2) through connections 342(1-2). Communications connections 342(1-2) may be wired (e.g. DSL, coaxial cable, fiber optic cables, etc.) or wireless (e.g. LTE, 3G, satellite, Wi-Fi, etc.).

In a non-limiting exemplary network configuration shown in system 300, an aggregation server 310 is optionally located on cloud-based computing servers, and is configured to collect power grid metrics from one or more sensors 320(1-2). The aggregation server 310 securely stores, processes and analyzes a power grid network (e.g. power grid 160 of FIG. 1) via a communications network (e.g. communications network 162 of FIG. 1).

In one embodiment of system 300, a modem termination system 302, other network equipment 304, or sensors 320 (1-2) are connected to an aggregation server 310 through secure communications connections 340. Each of these network components may optionally include a data collection element 308(a-b) or remote collection elements 330 (some not pictured). Sensors 320(1-2) may be the same or different embodiments as sensors 202 in system 200 and 150 in system 100. Additionally, sensors 320(1-2) may be contained within or connected to customer premise equipment (CPE) 322 in some embodiments.

In the exemplary embodiment of a data collection network shown in system 300, an aggregation server 310 utilizes secure communications channels 340 to request and receive sensor 320(1-2) data. Such sensor data may be sent back to the aggregation server 310 on either a time interval or real-time basis. Exemplary secure channel configurations may include virtual private networks (VPNs), traffic tunnels, HTTP/S, or alternative similar secure network communication means deployable over communications network 340. Alternatively, an aggregation server 310 may communicate indirectly with sensors 320(1-2) through a modem termination system 302 or other network equipment 304. Remote sensors 320(2) may be deployed for additional monitoring uses which in some embodiments include additional metrics such as temperature, noise, humidity etc. In such embodiments, an optional remote collection element 330 is configured to receive wireless data communications 342(2) from remote sensors 320(2) using wireless protocols such as LTE, 3G, satellite, Wi-Fi, Bluetooth, Zigbee, etc.

FIG. 4 is a flowchart illustrating one exemplary method 400 that an aggregation server may use to complete a secure push or pull data request 430 to individual or groups of sensors. The data request can collect real-time or time interval metrics, or both. In one exemplary method 400, power grid metrics (such as status, voltage, current, resistance, etc.) are sent to an aggregation server via data request 430.

Method 400 includes a request initiation step 402, a request validation step 404 with optional rejection 412, a decision step 405, a retrieve call step 406, a send step 408, and a processing and analysis step 410.

In step 402 an aggregation server makes a call to a sensor or a sensor's optional internal data collection element(s). One example of step 402 is aggregation server 310, 210, 110 sending a rest API call to a sensor for data.

In method step 404 a sensor receives the request via a channel (e.g. HTTP/S or other similar communication protocol or secure communication protocol) and validates the request. In decision step 405 if valid, the sensor then makes a request to any other sensor(s) downstream or internal sensing elements. If the request is invalidated the request is rejected through optional step 412 and the aggregation server is notified. Valid data requests to sensor(s) are made through a secure data collection channel (e.g. simple network management protocol or similar secure protocol). One example of method step 404 is sensor 320, 202, 150 receiving a request from server 310, 210, 110 via a secure channel or communication protocol.

In method step 406 the aggregation server retrieve data collected from each validated data collection element. One example of step 406 is aggregation server 310, 210, 110 receiving data from sensor 320, 202, 150.

In step 408 the data collection element(s) sensor data received from sensors is sent back to the aggregation server via a secure channel, completing that data request cycle. In some embodiments the exemplary data request cycles shown in method 400 could occur at a variety of intervals, from sub-second requests to daily ones.

In step 410 sensor data is received from the collection element in the aggregation server where it is processed by applying granular-level consensus voting and predictive machine learning analysis to construct network visualizations tailored for a variety of uses cases, such as power grid monitoring, outage management and mitigation, power and communications network restoration estimates, adjacent network confirmation of network status, etc.

FIG. 5 schematically illustrates one embodiment of a network data aggregation and processing system 500 that enables advanced situational awareness, prediction, and anomaly detection in a network. In this embodiment the data collected can be processed using a machine learning to improve anomaly and cybersecurity threat detection and visualization capabilities across an entire power grid. These capabilities has the benefit of being irrespective of individual power company boundaries and can provide previously unavailable cross-boundary perspectives.

Data aggregation and processing system 500 is shown to include a data gathering and processing stack 502 that contains layers of geospatial data, including network data 504. Network data 504 may be the same or similar network data as collected through the power grid monitoring system 164 of FIG. 1, for example. The data gathering and processing stack 502 can optionally include additional other layers of geospatial data, such as utility data 506, weather data 508, parcel data 510, or other data layers 512(1-n), in which n can be 0 or any integer. Data aggregation and processing system 500 is shown to include a power flow and threat modelling element 520, a visualization application 526, a machine learning application 522, and, optionally, a training application 524.

Data aggregation and processing system stack ("data stack") 502 is coupled with a visualization application 526 via a real-time data communications channel 530, which delivers real-time data from the data stack 524 to the visualization application 526. The data stack 502 is further coupled with a power flow and threat modeling element 520 via communications channel 536 which delivers historical data into the power flow and threat modeling element 520. The power flow and threat modeling element 520 is connected with the machine learning application ("MLA") 522 via a communications channel 538. The MLA 522 is also directly coupled with the data stack 502 via communications channels 532 and 534 and receives both real-time and historical data from the data stack. The visualization application 526 and the MLA 522 are connected via communications channel 544 such that analysis in the MLA 522 can be visualized in the visualization application 526. The MLA 522 and visualization application 526 can, optionally, be connected through an intermediary training application 524 via communications channels 542 and 540. Communications channels 530, 532, 534, 536, 538, 540, 542, and 544 discussed herein are a means for secure data transfer, such as through a wired connection (e.g. Ethernet, DSL, coaxial cable, fiber optic cable, etc.), or through a wireless one (e.g. Bluetooth, Zigbee, LTE, 3G, satellite, Wi-Fi, etc.).

In one embodiment, a data gathering and processing stack 502 is utilized to aggregate communications network data layer 504 alongside any number of optional secondary data layers. While the complementary data layers needed will vary by application and analysis requirements, some examples of commonly utilized data layers would be network data 506, weather data 508, and/or parcel data 510. Additionally, other data layers **512(1-*n*) may be included in the data gathering and processing stack 502 as required by a specific application (n may be 1 or any integer). In this exemplary embodiment the data gathering and processing stack 502 is configured to produce geospatial data visualizations through a visualization application 526. In this or other embodiments, the data processing and intelligence system 500 can be configured to deliver real-time power flow and threat modelling through a power flow and threat modelling element 520. In any such embodiment a machine learning application 522 with optional training application 524 may be utilized to increase accuracy and efficiency of the visualization application 526 or power flow and/or threat modelling element 520**.

In this exemplary embodiment the data gathering and processing stack 502 delivers real-time sensor data to the visualization application 526 which utilizes said sensor data to produce visualizations based on specific application requirements (e.g. sensor mapping, voltage over time, power outages, etc.). Additionally, the visualization application 526 can be configured to utilize a machine learning application 522 to improve the quality of data used in the visualizations. The machine learning application receives data from the data stack 502 and applies machine learning algorithms to increase predictive capabilities. One example of which would be anticipating power outages through historical trends implying a correlation between weather events and power outages. This machine processed and classified data 544 is returned to the visualization application 526. Optionally, the machine learning application 522 may use an intermediary training application 524 to take real-time data observations 542 from the visualization application and apply training intelligence to the observed data. In this example, annotated data 540 is then feed into the machine learning application 522 to improve predictive abilities and accuracy. One example of a training application 524 would be adding a human 'trainer' to the system to annotate data and correct the machine learning application 522 and improve classification. In one embodiment the power flow and threat modelling element 520 receives historical data from the data processing and gathering stack 502 which is utilized to create cybersecurity or national security threat models. These models can be used to identify and/or anticipate attacks, false-alarms, outages, or other non-regular events on the network (e.g. power grid). Threat models can further, in some embodiments, be delivered to the machine learning application 522 via communications channel 538 to add an additional training mechanism.

FIG. 6 shows one example of an aggregate sensor data visualization 600 across a geographically distributed sensor network using an example consensual voting implementation. In one embodiment an example geography 602 has a plurality of sensors **610(1-*n*) (in which n may be 0 or any integer) located throughout the geography. The data visualization can employ a new method of consensus voting amongst the sensors 610(1-*n*) to determine consensus among a sub-geography or cluster 604(1-*n*)**(in which n may be 0 or any integer)

In existing large sensor datasets, there are a number of ways that one can perform sensor fusion so as to obtain a consensus reading of the sensors in a given area. A very simple one is to take an average over all readings, but it suffers from the fact that unless the variance in readings is small, it can wash out particular sensors with problematic readings. A better option is to take the majority vote of binary readings (e.g. anomalous or not), a method whose validity is based on the Condorcet Jury theorem from political science. The theorem addresses the relative probability of a given group of individuals arriving at a correct decision. Using such a technique a group that wishes to reach a decision by majority vote. One of the two outcomes of the vote is correct, and each voter has an independent probability p of voting for the correct decision. The theorem asks how many voters should be included in the group. The result depends on whether p is greater than or less than ½:

If p is greater than ½ (each voter is more likely to vote correctly), then adding more voters increases the probability that the majority decision is correct. In the limit, the probability that the majority votes correctly approaches 1 as the number of voters increases.

On the other hand, if p is less than ½ (each voter is more likely to vote incorrectly), then adding more voters makes things worse: the optimal jury consists of a single voter.

This technique has been used in ensemble learning in the field of artificial intelligence. An ensemble method combines the predictions of many individual classifiers by majority voting. Assuming that each of the individual classifiers predict with slightly greater than 50% accuracy, then the ensemble of their predictions will be far greater than their individual predictive scores. While useful, this technique suffers from the fact that it can only address a binary situation, as to whether or not the voltage is above or below a given set point. It thus misses a lot of fine detail that might be of relevance to monitor the state of the grid.

A major improvement over majority voting is disclosed herein and is illustrated in one example by ranking the relative readings of all sensors involved using a new variant of Borda Counting. One key advantage of this new method over simply finding the "worst" case sensor, is that the entire sensor suite is ranked so that the most extreme n sensors can be identified. The Borda count is intended to elect broadly-acceptable options, rather than those preferred by a majority, and so is known as a consensus-based voting system rather than a majoritarian one.

A network has both local and system-wide issues. Local issues can be investigated by analyzing data emanating from a single modem connected to a power supply in the grid. System wide issues involve multiple sensors/modems distributed over an area that stream data which fluctuates over time. We here describe a method that creates a consensus among many sensors and provides information on a system-wide basis or among clusters within the network. The system does not identify particular nodes that are causing a problem, only that the overall network or significant parts of it are mis-behaving in a particular way, i.e., one or more sensors are far out of range in a significant part of the network.

In one embodiment, this consensus voting method can be applied to sensor data collected on a power grid. In one example voltage issues in network devices within a given area and timeframe can be classified using both unsupervised learning and sensor fusion techniques. This method enlarges the scope of data analysis from single sensors to any number of those covering a potentially large given area. The architecture considered here consists of a number of devices, each of which has one or more sensor values associated with it (e.g. queue length, power level, latency, etc.) Each device may have different sensors measuring the certain quantities, possibly different levels of resolution and accuracy.

There must be a means of ranking the different sensor values for voting purposes. Sensor values can either have a pre-defined discretization or use historical data to define normalized ranges. For example, in the discrete case a three-state scheme could be green-yellow-red and the node would rank its current state preferences based on these three candidate choices—e.g., yellow-red-green, yellow-green-red, etc. In this example, if the value of the sensor is in the yellow range then yellow is top choice, and if the sensor value is closer to red than green, then red is the second choice.

In one example embodiment, a search for issues with voltages in a particular area at a given time can be completed. The voltage thresholds can be broken into 5 classes as a ratio of the 120V reference voltages and their respective labels are shown in Table 1, below.

TABLE 1

Example Voltage Labels

| Voltage (120 V) | Label |
|---|---|
| ( 1.05, inf ) | 5 |
| ( 1.02, 1.05 ] | 4 |
| (0.98, 1.02 ] | 3 |
| ( 0.95, 0.98 ] | 2 |
| [ 0, 0.95 ] | 1 |

Depending on the measured voltage, the device will be in one of the 5 states listed in the example shown in Table 1. These values can be used in conjunction with a Borda ranking as follows. For a given voltage the ranking is made according to the labels in order of their closeness to the given voltage. For example, if the given voltage is in the range [1.02, 1.035] then the Borda ranking is, in order of the labels, [1, 2, 4, 5, 3]. That is, label 4 gets a rank of 5 because the voltage is in the window of 4 and closer to label 3 than 5, etc. The results obtained from this example are shown in Tables 2 and 3, along with the majority vote results described above. As can be seen are cases where the majority vote and the consensual Borda count disagree on the state of the cluster. These differences can have implications for any actions to take. In particular, most of the majority labels are 5, which is the maximum out of bound range which could indicate a significant action should be taken. However, Borda count found the consensus voltage label to be only a 4, which requires less intervention. In this scenario the device owners may make unnecessary and costly changes if they used a majority voting scenario.

TABLE 2

Majority and Borda Voting with 100 clusters.

| Majority label | Borda label | % cases |
|---|---|---|
| 5 | 5 | 3 |
| 5 | 4 | 69 |
| 4 | 4 | 27 |
| 3 | 4 | 1 |

TABLE 3

Majority and Borda Voting with 200 clusters.

| Majority label | Borda label | % cases |
|---|---|---|
| 5 | 5 | 1 |
| 5 | 4 | 57 |

TABLE 3-continued

Majority and Borda Voting with 200 clusters.

| Majority label | Borda label | % cases |
|---|---|---|
| 4 | 4 | 41.5 |
| 3 | 4 | 0.5 |

Although specific features of various embodiments may be shown in some drawings and not in others, this is for convenience only. In accordance with the principles of the systems and methods described herein, any feature of a drawing may be referenced or claimed in combination with any feature of any other drawing.

Some embodiments involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a programmable logic unit (PLU), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method for establishing power grid situational awareness to detect and interpret anomalies, the method comprising:
collecting sensor readings representing metrics of a power grid at least partially by (i) sending requests for said sensor readings from an aggregation server to a plurality of sensors of communication network nodes via one or more secure data collection channels and (ii) receiving said sensor readings at said aggregation server from said communication network nodes via said one or more secure data collection channels in response to said requests for said sensor readings, said communication network nodes (a) being configured to provide communication services to one or more locations that receive power from said power grid and (b) being on one or more communication paths that are separate from said power grid;

generating visualizations of said sensor readings; and applying machine learning processing to improve visualization of sensor data and anomaly detection.

2. The method of claim 1, wherein said machine learning processing incorporates power flow and threat modeling based on historical sensor data to increase predictive accuracy.

3. The method of claim 1, wherein said machine learning processing incorporates classification error collection data to increase predictive accuracy.

4. The method of claim 1, wherein one or more additional geospatial datasets are combined with said collected sensor readings to provide enhanced situational awareness across a plurality of dimensions.

5. The method of claim 4, wherein said one or more additional geospatial datasets comprise one or more of utility data, weather data, and parcel data.

6. The method of claim 1, wherein generating visualizations of said sensor readings comprises obtaining real-time data from a data stack.

7. The method of claim 1, wherein visualizations of said sensor readings comprise one or more of sensor mapping, voltage over time, and power outage information.

8. The method of claim 1, wherein applying machine learning processing to improve visualization of sensor data and anomaly detection comprises anticipating power outages through historical trends.

9. The method of claim 8, wherein said historical trends include correlation between weather events and power outages.

10. The method of claim 1, wherein said plurality of sensors is distributed across respective service areas of two or more different electricity providers.

11. The method of claim 1, further comprising improving classification processing through classification error correction.

12. A method for establishing power grid situational awareness, the method comprising:

collecting sensor readings representing one or more metrics of a power grid using at least partially by (i) sending requests for said sensor readings from an aggregation server to a plurality of sensors via one or more secure data collection channels and (ii) receiving said sensor readings at said aggregation server from said plurality of sensors via said one or more secure data collection channels in response to said requests for said sensor readings, said plurality of sensors being electrically coupled to said power grid, and said plurality of sensors being associated with one or more communication network nodes (a) being configured to provide communication services to one or more locations that receive power from said power grid and (b) being on one or more communication paths that are separate from said power grid;

storing said sensing readings as a network data layer;

aggregating said network data layer with one or more secondary data layers to generate a stack of data layers; and producing a geospatial visualization of said stack of data layers.

13. The method of claim 12, wherein said plurality of sensors is distributed across respective service areas of two or more different electricity providers.

14. The method of claim 12, wherein said one or more secondary data layers comprise one or more of a utility data layer, a weather data layer, and parcel data layer.

15. The method of claim 12, further comprising using a machine learning application to improve quality of data used in said geospatial visualization.

16. A method for establishing power grid situational awareness, the method comprising:

collecting sensor readings representing one or more metrics of a power grid at least partially by (i) sending requests for said sensor readings from an aggregation server to a plurality of sensors via one or more secure data collection channels and (ii) receiving said sensor readings at said aggregation server from said plurality of sensors via said one or more secure data collection channels in response to said requests for said sensor readings, said plurality of sensors being electrically coupled to said power grid, and said plurality of sensors being associated with one or more communication network nodes (a) being configured to provide communication services to one or more locations that receive power from said power grid and (b) being on one or more communication paths that are separate from said power grid;

storing said sensing readings as a network data layer; and applying machine learning to at least said network data layer to generate a threat model of said power grid.

17. The method of claim 16, wherein said plurality of sensors is distributed across respective service areas of two or more different electricity providers.

* * * * *